United States Patent [19]
Li

[11] Patent Number: 5,926,701
[45] Date of Patent: Jul. 20, 1999

[54] THIN FILM TRANSISTOR FABRICATION TECHNIQUE

[75] Inventor: Jia Li, San Antonio, Tex.

[73] Assignee: Sony Electronics, Inc., Park Ridge, N.J.

[21] Appl. No.: 08/887,574

[22] Filed: Jul. 3, 1997

Related U.S. Application Data

[63] Continuation of application No. 08/361,207, Dec. 21, 1994, abandoned.

[51] Int. Cl.$^6$ ..................................................... A01L 21/84
[52] U.S. Cl. ............................................. 438/158; 438/976
[58] Field of Search ..................................... 438/158, 159, 438/160, 976

[56] References Cited

U.S. PATENT DOCUMENTS

| | | |
|---|---|---|
| 4,625,224 | 11/1986 | Nakagawa et al. . |
| 5,071,779 | 12/1991 | Tanaka et al. .......................... 437/101 |
| 5,097,297 | 3/1992 | Nakazawa . |
| 5,122,849 | 6/1992 | Tanaka et al. . |
| 5,173,753 | 12/1992 | Wu .......................................... 437/101 |
| 5,198,377 | 3/1993 | Kato et al. .............................. 437/101 |
| 5,273,919 | 12/1993 | Sano et al. .............................. 437/101 |
| 5,284,789 | 2/1994 | Mori et al. . |
| 5,286,659 | 2/1994 | Mitani et al. ............................. 437/21 |
| 5,356,824 | 10/1994 | Chovan et al. ......................... 437/101 |

FOREIGN PATENT DOCUMENTS

| | | | |
|---|---|---|---|
| 62-205664 | 9/1987 | Japan | ................................ 437/40 TFI |
| 4-130734 | 5/1992 | Japan | ................................ 437/40 TFI |
| 6-37110 | 2/1994 | Japan | ................................ 437/40 TFI |

OTHER PUBLICATIONS

Wolf et al., Silicon Processing for the VLSI Era vol. 1:Process Technology, Sunset Beach, CA:Lattice Press, 1986, pp. 407–409.

*Primary Examiner*—Richard Booth
*Attorney, Agent, or Firm*—Wood, Herron & Evans, LLP

[57] ABSTRACT

An improved method of forming thin film transistors includes depositing a gate dielectric material over a gate electrode and subsequently depositing a polysilicon layer over the dielectric layer. Prior to applying a photoresist material, the polysilicon layer is coated with a protective layer of, for example, silicon oxide. A photoresist material is then applied and the polysilicon layer subsequently selectively etched to form the transistor body. Finally, any masking material is removed. The protective silicon dioxide layer prevents ion contamination of the polysilicon transistor body which can occur during the masking procedure, during the etch procedure, or during subsequent removal of any foreign mask and cleaning procedures. This will, in effect, enable one to prepare transistors with a better-defined threshold.

5 Claims, 1 Drawing Sheet

THIN FILM TRANSISTOR FABRICATION TECHNIQUE

This application is a file wrapper continuation of application Ser. No. 08/361,207 filed on Dec. 21, 1994 now abandoned.

BACKGROUND OF THE INVENTION

Thin film transistors are used in metal oxide semiconductor SRAM fabrication processes and are also frequently used in flat panel liquid crystal displays, as well as many other applications.

Thin film transistors are formed using a variety of different processes. A typical process is illustrated in FIGS. 1A–1D. A conduction layer, typically a layer of highly doped polysilicon, is deposited and lithographically defined as a gate electrode 12 on the substrate 11 which typically is a silicon wafer which may have bulk transistors, interconnect layers and contact holes in place. Next, a gate dielectric 13 such as silicon dioxide or silicon nitride is applied and annealed as necessary. An open contact may be formed, as required, depending upon the particular application. The transistor body layer 14 is applied and this is typically a layer of polysilicon.

In order to form the transistor body from the transistor body layer, a mask 15 is lithographically applied to define the channel, the source and the drain (not shown), as required. The unmasked portion of the body layer is then etched and the mask is removed and the wafer cleaned. This provides the transistor body 16 above the gate electrode 12 separated by the gate dielectric 13. A screening oxide layer 17 is then applied. One can then implant the thin film transistor channel, dope the drain and the source, as required for the particular application.

In applying and removing the photoresist mask, etching the polysilicon layer, and subsequent cleaning of the polysilicon layer, the polysilicon transistor body is contaminated. Applying, curing and subsequently removing the photoresist layer can cause impurities to migrate onto the surface or into the polysilicon layer. Mobile ions present in the photoresist material and etchant can alter the threshold of the transistor. Further, boron from the air can alter the threshold of the transistor. This also affects the useful life of the transistor. In the past, this degradation of the transistor body was either accepted or somewhat reduced by further cleaning the transistor body. But there was no good way to prevent such problems.

SUMMARY OF THE INVENTION

The present invention is premised on the realization that the degradation of the polysilicon transistor body can be avoided by altering the fabrication process of the transistor.

More particularly, the present invention is premised on the realization that coating the polysilicon transistor body layer with a protective silicon oxide layer prior to photolithographically defining and etching the polysilicon layer prevents degradation to the transistor body during photolithography and the subsequent etching and cleaning processes.

The transistor body can then be formed by masking the protective silicon oxide layer and thereby the polysilicon layer and sequentially etching the oxide layer and the polysilicon layer to form the body of the transistor.

This will, at the same time, leave a layer of silicon oxide between the mask and the transistor body. The mask can be removed without any degradation to the transistor body and the transistor can then be formed by implanting dopants into channels, drains and source electrodes according to standard techniques.

Thus, by practicing the present invention the degradation to the transistor is significantly reduced or eliminated, thereby extending the useful life of the transistor and improving its reliability.

The advantages of the present invention will be further appreciated in light of the following detailed drawings in which

DETAILED DESCRIPTION

Figure 1A:
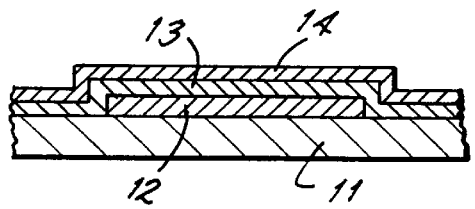
FIG. 1A–1D are diagrammatic depictions in cross-section of a prior art process of forming thin film transistors.
Figure 2:
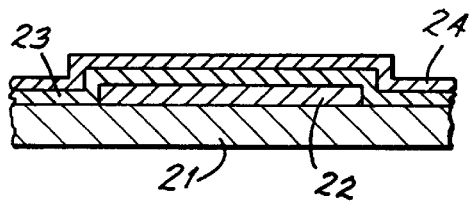
FIG. 2 is a cross-sectional diagrammatic depiction of a first step of the present invention.
Figure 1B:
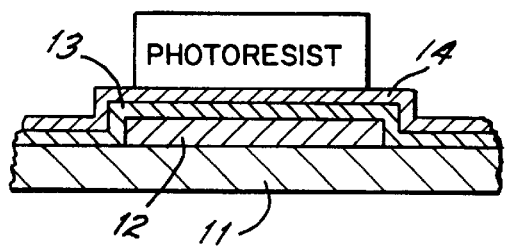
Figure 3:
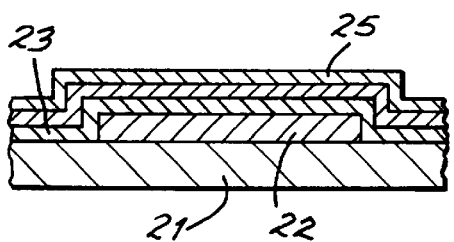
FIG. 3 is a diagrammatic cross-section of a second step used in the present invention.
Figure 1C:
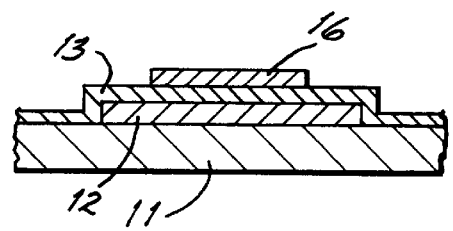

In order to form a thin film transistor according to the method of the present invention, a gate electrode 22 is initially deposited upon a substrate surface 21. Generally, in practicing the present invention, the substrate 21 will be silicon, glass, quartz, sapphire or any other substrate typically employed for semiconductors. Generally, silicon wafers will be employed. These frequently already have both transistors and interconnect layers with vertical isolation layers and the like.

The gate electrode 22 is deposited on the semiconductor substrate 21 by low pressure chemical vapor deposition, sputtering or other appropriate method. The gate electrode 22 can be any suitable conductor such as highly doped polysilicon, tantalum silicide, or tungsten silicide.

After the gate electrode layer has been deposited, photolithographically defined and etched, and the wafer cleaned, a gate dielectric layer 23 is deposited. The dielectric material 23 may be any typical insulating material such as silicon nitride or silicon dioxide and the like. These can be deposited by low pressure chemical vapor deposition or plasma enhanced chemical vapor deposition.

The preferred method of depositing this film is low pressure chemical vapor deposition. Preferably, the film will be a layer of silicon dioxide having a film thickness of about 100 to about 1,000 Å, depending on the particular application. After deposition, the silicon oxide layer can be annealed as may be required.

Subsequent to deposition of the gate dielectric layer 23, optional contact holes (not shown) may be opened as required to connect the to-be-deposited transistor body layer to any underneath layer, and then the thin film transistor body layer 24 is deposited. This layer 24 can be any semiconductor layer suitable for use as a transistor body. Generally, polycrystalline silicon is employed. The particular thickness of the semiconductor layer 24 will vary according to desired application.

The polycrystalline silicon layer 24 is likewise deposited by known techniques such as low pressure chemical vapor deposition. This can either be deposited as a polysilicon layer or can be deposited as amorphous silicon and annealed at a temperature of about 650° C. to form the polysilicon.

The semiconductor layer 24 is next coated with a screening oxide layer 25. The screening oxide layer will generally be a silicon oxide layer, preferably deposited by chemical vapor deposition. It will generally have a thickness of 100 to 150 Å.

Figure 4:
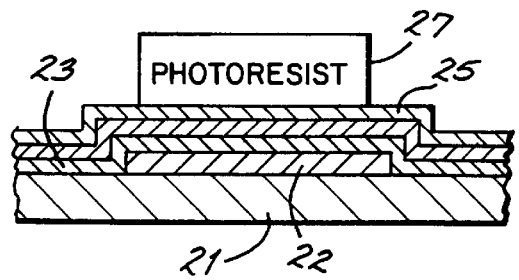
FIG. 4 is a diagrammatic cross-sectional view of a third step used to form the present invention.
Figure 1D:
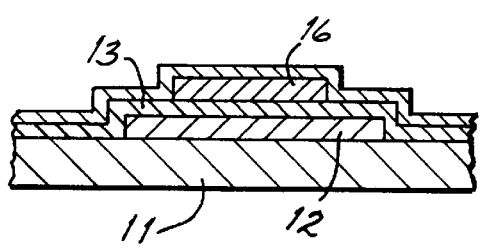

Next, a photo resist masking layer (image) is deposited. The photo resist layer is then selectively exposed and developed according to standard methods to photolithographically establish the photo resist image 27 in the desired location, as shown in FIG. 4. The selection of the appropriate photo resist material is a matter of choice. Commercially available photoresist materials are available and can be purchased, for example, from Hoechst Celanese Corporation or Shipley Company.

Next, the screening oxide layer 25 and the thin film transistor body layer 24 are etched away, leaving only those portions 28 and 29 protected by the photo resist image 27.

The screening oxide and the polysilicon material are etched away using a plasma etcher. Initially, the unprotected screening oxide material is etched away using plasma etching in an environment of, for example, $SF_6+Cl_2+CH_2F_2$. A plasma etcher again is used to etch away the unmasked transistor body layer. This can also be done in the same plasma etcher, if so desired, right after etching the screening oxide. Etching chemistry can be the same or different, a matter of choice.

Figure 5:
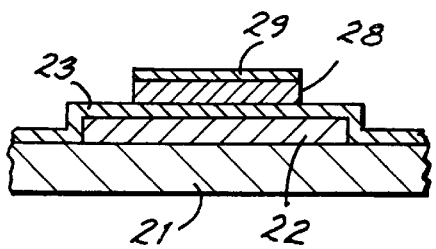
FIG. 5 is a cross-sectional view of a thin film transistor made according to the method of the present invention.

As shown in FIG. 5, the masking portions of the photoresist layer are then removed using the appropriate solvent or acid solution effective for the particular photoresist material.

The formed transistor body is then further processed as desired by appropriate doping to establish the source, the drain, and the channel. These are all formed by standard transistor forming techniques.

In a more specific embodiment, a transistor can be formed according to the following procedure which is merely exemplary for practicing the present invention.

On top of a silicon wafer which has bulk transistors and interconnect lines and isolations in place and contact holes open, deposit 500 Å of polysilicon. Subsequently, implant 2.0E14 boron ions per $cm^2$ into the polysilicon layer and anneal the silicon layer at 850° C. for 10 minutes.

Coat the wafer with a photoresist material. Align and expose the photoresist on a stepper with a photo mask and then develop the photoresist. This will leave the photoresist only on the portion of the wafer where the polysilicon will remain as the TFT gate electrodes and connection lines. Next, etch the polysilicon and subsequently ash the photoresist in oxygen plasma and clean the wafer. 500 Å of silicon dioxide is then deposited onto the wafer, and this is annealed in oxygen at 850° C. for 10 minutes. Coat the wafer with a photoresist, and align and expose the photoresist with a mask so that there is photoresist everywhere on top of the wafer except where the contact holes will be formed. Etch the oxide and ash the photoresist in oxygen plasma and clean the wafer.

200 Å of amorphous silicon should then be deposited on the silicon wafer and the wafer annealed at 650° C. for 10 hours in nitrogen to convert the amorphous silicon to polysilicon.

Deposit 100 Å of silicon dioxide on the wafer, coat the wafer with a photoresist, and align and expose the photoresist on a stepper with a photomask which leaves the photoresist on top of the wafer only in places where the TFT channels, sources, drains and connection lines will be. Etch the oxide and subsequently etch the polysilicon. The photoresist is then ashed in oxygen plasma and the wafer cleaned.

Coat the wafer again with a photoresist and align and expose the photoresist on a stepper with a photomask so that photoresist covers the wafer except where the polysilicon layer will act as TFT sources, drains and connection lines.

Implant 1.0E14 Boron ions per $cm^2$ into the last polysilicon layer to make the connection lines, TFT sources and TFT drains highly conductive. The photoresist is then etched in oxygen plasma and the wafer cleaned to complete the TFT fabrication process.

This is merely exemplary of a specific embodiment of practicing the present invention. This, obviously, can be varied, depending upon the particularly desired TFT and semiconductor.

The method of the present invention provides a thin film transistor which is more reliable, having a better defined threshold, and should be longer-lived due to the reduced attack on the transistor body layer during processing. The protective oxide layer prevents contaminants from acting on the transistor body layer and the gate dielectric layer, thereby improving reliability as well as durability. This is accomplished without any significant increase in fabrication costs.

This has been a description of the present invention, along with the best mode currently known of practicing that invention. However, the invention itself should only be defined by the appended claims wherein

I claim:

1. A method of forming a thin film transistor comprising establishing a thin film transistor body layer over a gate electrode and a dielectric layer, coating said thin film transistor body layer with a protective layer, simultaneously photolithographically etching said protective layer and said thin film transistor body layer to establish a thin film transistor covered with a protective layer and implanting ions through said protective layer into said thin film transistor body.

2. The method claimed in claim 1 wherein said transistor body is photolithographically established by depositing a layer of mask material over said protective layer, photolithographically defining a mask member, etching said protective layer and said thin film transistor body layer to remove only portions of said protective layer and said thin film transistor body layer not covered by said mask member, chemically removing said mask member, thereby leaving said thin film transistor body covered with said protective layer.

3. The method claimed in claim 2 wherein said protective layer is selected from the group consisting of silicon nitride and silicon oxide.

4. The method claimed in claim 2 wherein a drain electrode, a source electrode, and a channel are formed for said transistor.

5. A method of forming a thin film transistor over a semiconductor substrate comprising depositing a gate electrode layer on said semiconductor surface, photolithographically defining and subsequently etching said layer to form a gate electrode, coating said gate electrode with a gate dielectric, coating said gate dielectric with a thin film transistor body layer, coating said thin film transistor body layer with a protective layer, wherein said protective layer is selected from the group consisting of silicon dioxide and silicon nitride, establishing a mask member above said protective layer, simultaneously etching said protective layer and said thin film transistor body layer to remove all but portions of said layers protected by said mask, thereby forming a thin film transistor body above said gate electrode and said gate dielectric, separated from said mask by said protective layer;

removing said mask and implanting ions through said protective layer into said thin film transistor body.

* * * * *

UNITED STATES PATENT AND TRADEMARK OFFICE
CERTIFICATE OF CORRECTION

PATENT NO. : 5,926,701
DATED : July 20, 1999
INVENTOR(S) : Jia Li

It is certified that error appears in the above-identified patent and that said Letters Patent is hereby corrected as shown below:

Claim 3, line 1, reads "protective layer", it should read "protective oxide layer".

Claim 4, line 2, reads "formed for said", it should read "formed on said".

Signed and Sealed this

Eighteenth Day of July, 2000

*Attest:*

Q. TODD DICKINSON

*Attesting Officer*　　　*Director of Patents and Trademarks*